US008853641B2

(12) United States Patent
Mazzillo (10) Patent No.: US 8,853,641 B2
(45) Date of Patent: Oct. 7, 2014

(54) PHOTODETECTOR DEVICE WITH PROTECTIVE AND ANTIREFLECTIVE COVER, AND MANUFACTURING METHOD THEREOF

(75) Inventor: Massimo Cataldo Mazzillo, Bari (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 156 days.

(21) Appl. No.: 13/443,004

(22) Filed: Apr. 10, 2012

(65) Prior Publication Data
US 2013/0020491 A1 Jan. 24, 2013

(30) Foreign Application Priority Data
Jul. 19, 2011 (IT) ................ TO2011A0649

(51) Int. Cl.
*G01J 1/42* (2006.01)
*H01L 31/108* (2006.01)
*H01L 31/0312* (2006.01)
*H01L 31/0216* (2014.01)

(52) U.S. Cl.
CPC ...... *H01L 31/02161* (2013.01); *H01L 31/1085* (2013.01); *H01L 31/0312* (2013.01); *G01J 1/429* (2013.01)
USPC ....................................................... 250/372

(58) Field of Classification Search
USPC .................... 250/372, 339.02, 332
See application file for complete search history.

(56) References Cited

U.S. PATENT DOCUMENTS

| | | | |
|---|---|---|---|
| 7,372,038 B2 * | 5/2008 | Hassard et al. | 250/372 |
| 8,498,694 B2 * | 7/2013 | McGuire et al. | 600/476 |
| 2008/0277606 A1 * | 11/2008 | Wang et al. | 250/581 |
| 2009/0302228 A1 * | 12/2009 | Hadjioannou et al. | 250/370.08 |
| 2010/0080914 A1 * | 4/2010 | Forrest et al. | 427/259 |
| 2010/0178722 A1 * | 7/2010 | de Graff et al. | 438/65 |
| 2011/0263108 A1 * | 10/2011 | Lan et al. | 438/492 |
| 2011/0266460 A1 * | 11/2011 | Martinelli et al. | 250/459.1 |
| 2011/0309331 A1 * | 12/2011 | Yu et al. | 257/21 |
| 2012/0038881 A1 * | 2/2012 | Amirparviz et al. | 351/160 R |
| 2012/0153860 A1 * | 6/2012 | Wang et al. | 315/291 |

FOREIGN PATENT DOCUMENTS

TW I258868 7/2006

OTHER PUBLICATIONS

Author: Young-Hwan Kim, Kyeong-Sik Shin, Ji-Yoon Kang, Eun-Gyeong Yang, Kyeong-Kap Paek, Dae-Shik Seo, and Byeong-Kwon Ju, Title: Poly(dimethylsiloxane)-Based Packaging Technique for Microchip Fluorescence Detection System Applications, Date: Oct. 2006, Publisher: Journal of Microelectromechanical Systems, vol. 15, No. 5.*
Mazzillo et al., 4H-SiC Schottky Photodiode Based Demonstrator Board for UV-Index Monitoring, IEEE Sensors Journal, Feb. 2, 2011, pp. 377-381, vol. 11, No. 2., IEEE.

(Continued)

*Primary Examiner* — David Porta
*Assistant Examiner* — Taeho Jo
(74) *Attorney, Agent, or Firm* — Allen, Dyer, Doppelt, Milbrath & Gilchrist, P.A.

(57) ABSTRACT

The photodetector device includes a semiconductor body having a front surface, and an active-area region that extends in the semiconductor body facing the front surface and is configured for receiving a light radiation and generating, in response to the light radiation received, electric charge carriers. A polydimethylsiloxane cover layer extends on the front surface in the active-area region so that the light radiation is received by the active-area region through the cover layer.

19 Claims, 8 Drawing Sheets

(56) References Cited

OTHER PUBLICATIONS

Sciuto et al., On the Aging Effects of 4H-SiC Schottky Photodiodes Under High Intensity Mercury Lamp Irradiation, IEEE Photonotics Technology Letters, Jun. 1, 2010, pp. 775-777, vol. 22, No. 11, IEEE.

Adams, Integration of Optoelectronics and Microfluidics for Biological and Chemical Sensing, Thesis, 2004, pp. 1-166, California Institute of Technology, Pasadena, California.

Desphande et al., Optical Properties of Silicon Nitride Films Deposited by Hot Filament Chemical Vapor Deposition, Journal of Applied Physics, Jun. 15, 1995, pp. 6534-6541, vol. 77, Issue 12, Journal of Applied Physics, American Institute of Physics.

Yu et al., Excitonic Photoluminescence Characteristics of Amorphous Silicon Nanoparticles Embedded in Silicon Nitride Film, The European Physical Journal, May 25, 2007, 1 page, The European Physical Journal.

Park et al., Bulk and Interface Charge in Low Temperature Silicon Nitride for Thin Film Transistors on Plastic Substrates, Journal of Vacuum Science and Technology, Nov./Dec. 2004, pp. 2256-2260, A 22(6), American Vacuum Society.

Shaw et al., Deep UV Photon-Counting Detectors and Applications, Advanced Photon Counting Techniques III. Ed., SPIE 2009, 16 pages, SPIE vol. 7320, The International Society for Optical Engineering.

Park et al., High Quantum-Efficiency 4H-SiC UV Photodiode, Journal of the Korean Physical Society, pp. 123-131, vol. 30, No. 1, Feb. 1997.

Fresnel, Fresnel's Equations for Reflection and Refraction, 46 pages, available at www.teknik.uu.se/ftf/education/ftf2/Optics_FresnelsEqns.pdf.

Mazzillo et al., Highly Efficient Low Reverse Biased 4H-SiC Schottky Photodiodes for UV-Light Detection, IEEE Photonics Technology Letters, pp. 1782-1784, vol. 21, No. 23, Dec. 1, 2009.

Sciuto et al., High Responsivity 4H-SiC Schottky UV Photodiodes Based on the Pinch-Off Surface Effect, Applied Physics Letters, 3 pages, No. 89, 2006 American Institute of Physics.

Razeghi et al., Semiconductor Ultraviolet Detectors, Journal of Applied Physics, pp. 7433-7473, vol. 79, No. 10, May 15, 1996, American Institute of Physics.

Sciuto et al., "Photocurrent Gain in 4H-SiC Interdigit Schottky UV Detectors With a Thermally Grown Oxide Layer", Applied Physics Letters, vol. 90, No. 22, May 2007, p. 223507.

\* cited by examiner

PHOTODETECTOR DEVICE WITH PROTECTIVE AND ANTIREFLECTIVE COVER, AND MANUFACTURING METHOD THEREOF

FIELD OF THE INVENTION

The present invention relates to a photodetector device provided with a cover layer designed to act as antireflective and protective layer, and to a corresponding manufacturing method.

BACKGROUND OF THE INVENTION

The wavelengths of ultraviolet (UV) radiation are between approximately 100 nm and approximately 400 nm, and, within this range, are divided into three bands: band A (UV-A), including wavelengths between approximately 315 nm and 400 nm; band B (UV-B), including wavelengths between approximately 280 and 315 nm; and band C (UV-C), including wavelengths between approximately 100 and 280 nm. Recently, the growth of applications in which ultraviolet radiation or signals are used has increased the interest in devices designed to detect wavelengths in the ultraviolet range, in particular devices having a high value of the signal-to-noise ratio. Such applications include, for example, detection of biological agents via induced fluorescence, sterilization, monitoring of fires in closed environments (via detection of the presence of flames), non-line-of-sight covert communications, and others.

Currently, photomultiplier tubes (PMT) are widely used for the aforesaid applications. However, known photomultiplier tubes present some disadvantages that render use thereof limited or at times disadvantageous. For example, the quantum efficiency of these devices in the range of the UV wavelengths is low, they have large dimensions, high costs, require high biasing voltages, and are fragile.

In recent years, technological progress in the framework of technologies of growth of material on substrates of various types, and more in general in the framework of machining of semiconductors with wide band-gap, such as, for example, silicon carbide (SIC), has favored the development of UV-radiation detectors of an integrated type, made of semiconductor material. Such detectors include, for example, p-i-n photodiodes, avalanche photodiodes, Schottky-barrier diodes, metal-semiconductor-metal photodetectors, and others.

Semiconductor photodetectors may require, for optimized operation, a low dark current, which can be obtained using high-quality materials. In particular, semiconductors with a wide band-gap (wider than that of silicon) offer a low dark current (indicatively some orders of magnitude lower than that of silicon), ideal for the aforementioned application. Even more in particular, silicon carbide of a 4H type (known as 4H—SIC), with a band-gap value of approximately 3.26 eV, has been used experimentally for detection of ultraviolet radiation at a wavelength of 380 nm and shorter, i.e., below the range of the visible (approximately 400 nm), and has proved to be an excellent candidate for the development of UV detectors. Furthermore, since 4H—SiC is a semiconductor with indirect band-gap, photodetectors of this type are advantageous also at high temperatures of use (see, for example, M. Razeghi and A. Rogalski, "Semiconductor ultraviolet detectors", J. Appl. Phys., vol. 79, No. 10, pp. 7433-7473, 1996).

To improve the sensitivity at a wavelength in the ultraviolet range, Schottky diodes are usually preferred to p-n or p-i-n junction diodes, since generation of the charge carriers occurs at the surface of the semiconductor where a high "built-in" electrical field is present (on account, as is known, of the space-charge region at the metal-semiconductor junction). Furthermore, Schottky diodes are majority-carrier devices, which typically enable a faster response than does a p-n junction. Furthermore, Schottky diodes require a simpler manufacturing process than do p-i-n junction diodes.

Schottky diodes of a conventional type made of silicon carbide for application in the ultraviolet band foresee a top surface provided with a thin metal layer (Ni, Au, Pt) semi-transparent to the wavelengths of interest (typically in the 20-50 nm range), with a high value of the Schottky barrier (typically 1.4-1.8 eV) (see, for example, Yan et al., IEEE J. Quantum Electr. 40, 1315, (2004)). The surface metal layer is generally deposited by the sputtering or PVD (physical vapor deposition) technique. However, the sensitivity of these devices is usually low for wavelengths shorter than 300 nm, on account of the absorption of the ultraviolet radiation by the metal layer. To increase the quantum efficiency of SiC photodetectors, it is known to reduce the thickness of the aforementioned metal layer. This approach, however, can cause a problematic control of the uniformity of thickness of the Schottky barrier (which is extremely thin), with consequent problems of poor thermal and mechanical stability.

Direct exposure of the active area (i.e., of the space-charge region of the metal-semiconductor junction) to the radiation that it is desired to detect can be an alternative to improving the sensitivity of the photodetector for low wavelengths. For example, an embodiment has proven satisfactory of a Schottky diode of a vertical type, based upon 4H silicon carbide (4H—SiC) of an interdigitated type, based upon the pinch-off surface effect (see, for example, Mazzillo et al., IEEE Photon Technol. Lect., 21, 1782, (2009)). Such device has enabled an improvement in the efficiency of detection for low wavelengths. In fact, interdigitated geometry leaves exposed surface portions of active area of the photodetector, enabling a high value of efficiency of absorption also at low wavelengths, when the depth of penetration in the silicon carbide is very great (see, for example, A. Sciuto, F. Roccaforte, S. Di Franco, and V. Raineri, "High responsivity 4H—SiC Schottky UV photodiodes based on the pinch-off surface effect", Appl. Phys. Lect., Vol. 89, 081111, 2006).

Furthermore, use of a weakly doped epitaxial surface layer (with doping of between approximately $1 \cdot 10^{14}$ ions/cm$^3$ and $5 \cdot 10^{14}$ ions/cm$^3$), can favor reaching of the pinch-off condition (i.e., the condition of maximum photon-detection efficiency) between contiguous depleted regions around the interdigitated contacts, with low reverse voltage (also in the photovoltaic regime). Hence, so far, interdigitated Schottky photodiodes represent in the UV-detection range, a promising approach for ensuring high photon detection in all the ranges of UV wavelengths, with low power consumption (see, for example, M. Mazzillo, G. Condorelli, M. E. Castagna, G. Catania, A. Sciuto, F. Roccaforte and V. Raineri, "Highly efficient low reverse biased 4H—SiC Schottky photodiodes for UV-light detection", IEEE Photon. Technol. Lect., Vol. 21, No. 23, 2009, pp. 1782-1784).

However, the surface of exposed active area of interdigitated Schottky photodiodes must be protected to prevent damage thereto, for example, caused by the presence of dust, by chemical substances present in the environment where the photodetector is used, by handling of the photodetector by an operator, etc. One or more dielectric layers are typically used (for example, employing a plurality of different materials, with different thicknesses), deposited over the entire surface of the photodetector, and also over the contact metallizations.

Such dielectric layers should be appropriately deposited to form a cover to protect the surface of the photodetector that will at the same time provide a high efficiency of operation of the photodetector itself. Such cover should be antireflective, such as to optimize matching of the refractive indices at the interface at the various air-cover and cover-semiconductor interfaces.

It is known to provide antireflective and/or protective structures for photodetectors made of silicon oxide ($SiO_2$) and silicon nitride ($Si_3N_4$). In particular, an antireflective silicon-oxide layer can be formed on a silicon-carbide layer by thermal oxidation. Further known methods comprise PECVD (plasma-enhanced chemical vapor deposition) and LPCVD (low-pressure chemical vapor deposition).

Regarding growth via thermal oxidation, the silicon-carbide wafer is set in an oxidation oven, where a gas is introduced as precursor. Using oxygen ($O_2$) as precursor gas, a so-called "dry" oxidation is performed. Such process is relatively slow and can lead to a final layer containing crystallographic defects. By introducing a small amount of hydrochloric acid (HCl) into the oxidation oven, or another gas containing chlorine (for example TCE—trichloroethylene), it is possible to reduce the number of crystallographic defects of the layer grown, but there is the disadvantage of obtaining an oxide layer containing a certain percentage of chlorine. Using, instead, water vapor as precursor gas, an oxidation of a "wet" type is performed. The oxide layer that is obtained via the wet-oxidation process presents a lower quality than the oxide layer that can be obtained by dry oxidation, but the rate of growth is higher. Both of the processes require high temperatures, of between 900 and 1200° C.

The PECVD and LPCVD techniques enable deposition of silicon oxide at lower temperatures, but the oxide layer that is obtained presents a poor structural quality, in particular from a stoichiometric standpoint and the standpoint of density.

Irrespective of the particular technique of deposition or growth adopted, further disadvantages of an antireflective layer of silicon oxide on silicon carbide involve high stresses on the SiC—$SiO_2$ interface (in particular, for thick oxides), which can cause generation of leakage current and, in extreme cases, breakdown of the entire wafer.

The performance of 4H—SiC Schottky diodes has been studied for applications of photodetection in the presence of a layer of $SiO_2$ grown thermally on the SiC surface, with purposes of protection thereof. It has been found that pinch-off is affected in the surface region by (trapped) interface charges at the SiC—$SiO_2$ interface. The undesirable effect caused by the trapped charges is even more evident for low surface-doping levels, required when the device is operated at low reverse voltages. Reference may be made in this connection to A. Sciuto, F. Roccaforte, S. Di Franco, V. Raineri, S. Billotta, and G. Bonanno, "Photocurrent gain in 4H—SiC interdigit Schottky UV detectors with thermally grown oxide layer", Appl. Phys. Lect., Vol. 90, 223507, 2007.

Further disadvantages due to the presence of the protective $SiO_2$ layer comprise a reduction of the response time of the photodetector, an increase of the dark current, and an increase of the leakage currents.

An antireflective silicon-nitride layer can be formed on a silicon-carbide layer via the LPCVD or PECVD deposition technique. Employing the LPCVD technique, the silicon nitride can be deposited in a uniform and reproducible way. The layer obtained has good properties of cover of the edges and good thermal stability. However, the deposition temperatures are high (700-900° C.). The PECVD technique enables a faster deposition at a lower temperature (approximately 400° C.) with the same advantages.

However, on account of the differences in the crystalline structure between silicon carbide and silicon nitride, and/or on account of defects in the crystallographic structure of the silicon-nitride layer, voltages can be set up in the silicon-nitride layer that may even cause breakdown thereof. Furthermore, further stresses in the silicon-nitride layer are caused by variations of temperature, as highlighted in the literature (see, for example, S. Sze, "VLSI Technology", McGraw-Hill, 1983).

Silicon nitride (for example, deposited by the PECVD technique) has proven more suitable for use as passivation layer. The process of growth can be regulated so that the silicon-nitride layer grown has reduced stress; however, this does not rule out the possible presence of trapped charges at the SiC—$Si_3N_4$ interface (see, for example, K. J. Park and G. N. Parsons, "Bulk and interface charge in low temperature silicon nitride for thin film transistors on plastic substrates", J. Vac. Sci. Technol., vol. 22, No. 6 pp. 2256-2260, 2004). Furthermore, silicon nitride has a band-gap wider than silicon oxide. This means that silicon nitride can have a very high absorption for wavelengths in the 200-300 nm range.

It is evident that the problems generated by the use of protective layers of silicon nitride or silicon oxide are not limited to photodetector devices with substrates made of silicon carbide, but extend to generic substrates of semiconductor material, such as, for example, silicon, gallium, gallium arsenide, gallium nitride, and others still.

Finally, a protective layer is in any case necessary in view of packaging of the photodetector. Currently, packagings comprise a metal load-bearing structure provided with a ultraviolet-degree quartz window, which enables access of photons to the active area of the photodetector; however, the quartz window has a high cost. Plastic packagings are used to reduce costs, but may not guarantee an optimal protection from impact, vibrations, and other external factors. Furthermore, they may not form an adequate protective layer at high transmissivity in the ultraviolet, especially below 300 nm.

SUMMARY OF THE INVENTION

An object of the present embodiments is to provide a photodetector device with a cover layer of an improved type, and a corresponding manufacturing method, that is able to overcome the drawbacks of the known art.

According to the present approach a photodetector device with a cover layer of an improved type and a corresponding manufacturing method are provided. The present embodiments are directed to a photodetector device including a semiconductor body, having a front surface, and an active-area region which extends in the semiconductor body facing the front surface, configured for receiving a light radiation and generating, by the photoelectric effect in response to the light radiation received, electrical-charge carriers (in particular, an electron-hole pair, which, under the effect of an electrical field, generates an electric current). The photodetector device further includes a polydimethylsiloxane (PDMS) cover layer, which extends on the front surface in the active-area region so that the light radiation is received by the active-area region through the cover layer. The cover layer offers protection for the front surface of the semiconductor body and acts as antireflective layer for the light radiation received. The light radiation is, in particular, a UV radiation.

The particular physical structure of the photodetect or device is irrespective of the purposes of the present approach, provided that the photodetector device includes a PDMS cover layer which extends so that the light radiation is received by the active-area region through the cover layer.

BRIEF DESCRIPTION OF THE DRAWINGS

For a better understanding of the present invention, preferred embodiments thereof are now described, purely by way of non-limiting example and with reference to the attached drawings, wherein.

DETAILED DESCRIPTION OF THE PREFERRED EMBODIMENTS

The present embodiments relate to a photodetector device including a semiconductor body, having a front surface, and an active-area region which extends in the semiconductor body facing the front surface, configured for receiving a light radiation and generating, by the photoelectric effect in response to the light radiation received, electrical-charge carriers (in particular, an electron-hole pair, which, under the effect of an electrical field, generates an electric current). The photodetector device further includes a polydimethylsiloxane (PDMS) cover layer, which extends on the front surface in the active-area region so that the light radiation is received by the active-area region through the cover layer. The cover layer offers protection for the front surface of the semiconductor body and acts as antireflective layer for the light radiation received. The light radiation is, in particular, a UV radiation. The particular physical structure of the photodetector device is irrespective of the purposes of the present approach, provided that the photodetector device includes a PDMS cover layer which extends so that the light radiation is received by the active-area region through the cover layer.

Figure 1:
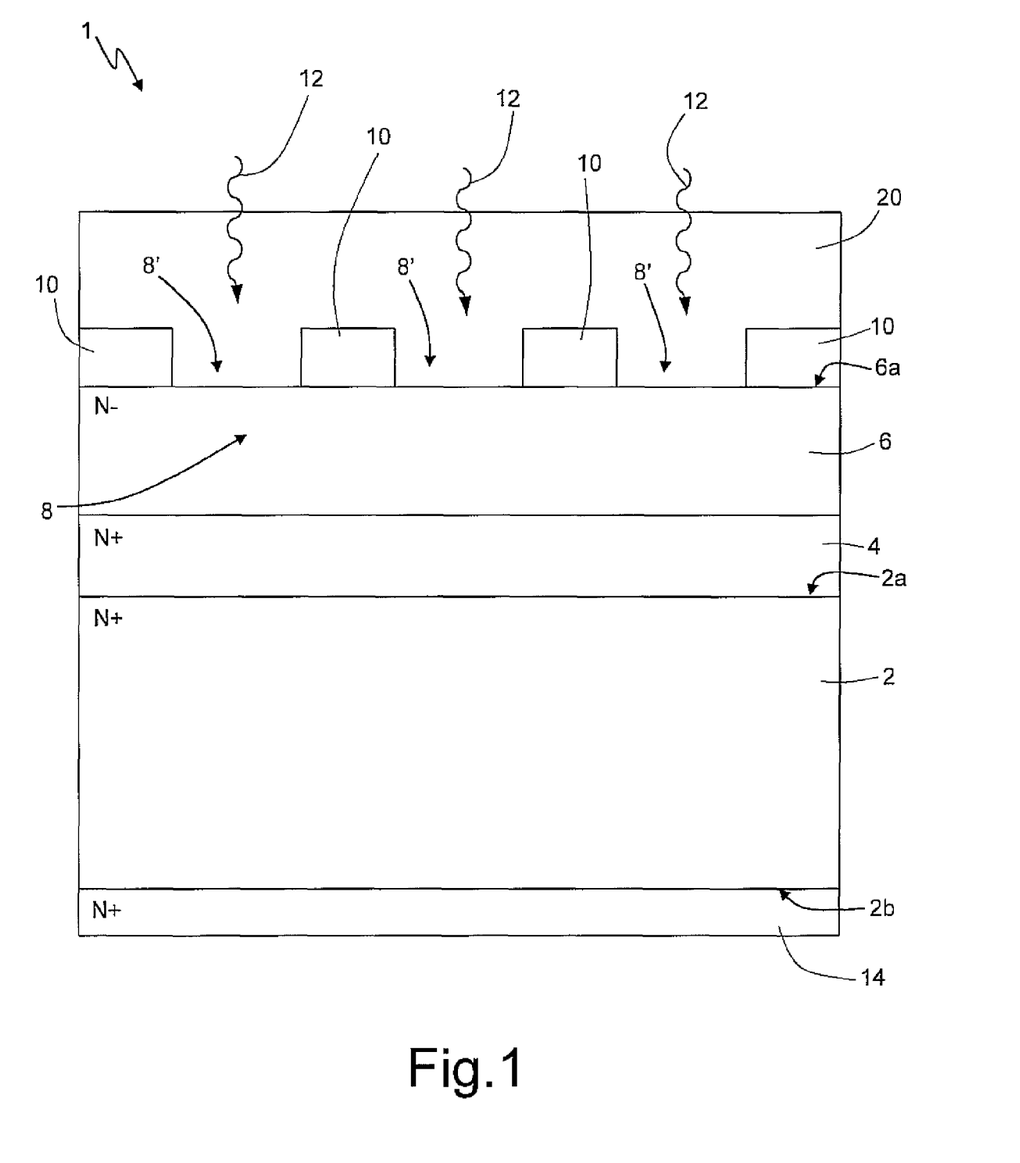
FIG. 1 is a schematic cross-sectional view illustrating a photodetector device according to a present embodiment.

FIG. 1 shows a photodetector 1 according to one embodiment of the present invention. The photodetector 1 is, in particular, a Schottky diode with a structure of the surface Schottky contacts of an interdigitated type.

In greater detail, the photodetector 1 includes a substrate 2, e.g. of silicon carbide, in particular 4H—SiC, with doped with a dose of approximately $1 \cdot 10^{19}$ ions/cm$^3$, having a front side 2a and a back side 2b. A buffer layer 4 of silicon carbide (in particular 4H—SiC) doped N+ with a dose of approximately $1 \cdot 10^{16}$ ions/cm$^3$ extends over the front side 2a of the substrate 2 and has the function of interface between the substrate and top layers with the function of matching of the doping profile. An active layer 6 of silicon carbide (in particular 4H—SiC) doped N− with a dose of approximately $1 \cdot 10^{14}$ ions/cm$^3$, extends over the buffer layer 4, and includes an active-area region 8 of the photodetector 1 facing the top surface 6a of the active layer 6. Schottky contacts 10 are formed over the top surface 6a of the active layer 6, and have a structure of an interdigitated type. In particular, the Schottky contacts 10 leave exposed surface portions 8' of the active area 8, configured for receiving, in use, a light radiation, in particular ultraviolet light (represented schematically in the figure by arrows 12). The photodetector 1 further includes a back contact terminal 14, formed on the back side 2b of the substrate 2 in ohmic contact with the latter.

In greater detail, the interdigitated structure of the Schottky contacts 10 includes a plurality of elements of elongated shape (fingers), which extend on the top surface 6a at a distance from one another (each finger defining, in the framework of the present description, a Schottky contact 10). In this way, between one Schottky contact 10 and another adjacent Schottky contact 10 there extends a surface portion 8' of the active area 8 directly exposed to a possible incident light radiation. Such surface portions 8' of active area 8 that extend between one Schottky contact 10 and another are hence not covered by metal (or in general conductive) structures that could reduce considerably the intensity of light radiation received by the active area.

According to the present approach, the photodetector 1 further includes a cover layer 20 of PDMS (polydimethylsiloxane). According to the embodiment of FIG. 1, the cover layer 20 extends over the top surface 6a of the active layer 6, in an area corresponding to, and in direct contact with, the surface portions 8' of the active area 8 between the Schottky contacts 10, and also over the Schottky contacts 10. The cover layer 20 has both an antireflective function (illustrated in greater detail hereinafter) and a function of protection for the surface of the device (in particular, it is designed to protect the photodetector 1 from dust, contaminating elements, and in general from phenomena of ageing deriving from use).

As an example, the substrate has a thickness of between approximately 200 μm and 400 μm; the buffer layer 4 has a thickness of between approximately 0.5 μm and 1 μm; the active layer 6 has a thickness of between approximately 2 μm and 20 μm; each Schottky contact has a thickness of between approximately 1 μm and 3 μm; and the cover layer 20 has a thickness of between approximately 50 μm and 3 mm.

In use, the photodetector 1 generates an electric current proportional to the intensity of the light radiation that impinges on the active area 8 thereof. As will be appreciated by those skilled in the art, operation is based upon the mechanism of absorption of the electromagnetic radiation and consequent generation of an electron-hole pair in the active area B. Then, under the action of an external electrical field (applied between the Schottky contacts 10 and the back contact terminal 14), a photoconduction current is generated, which flows vertically through the active layer 6, the buffer layer 4, and the substrate 2. The biasing applied in use between Schottky contacts 10 and the back contact terminal 14 has a value, for example, of between 0 V and −20 V (reverse biasing).

Figure 2:
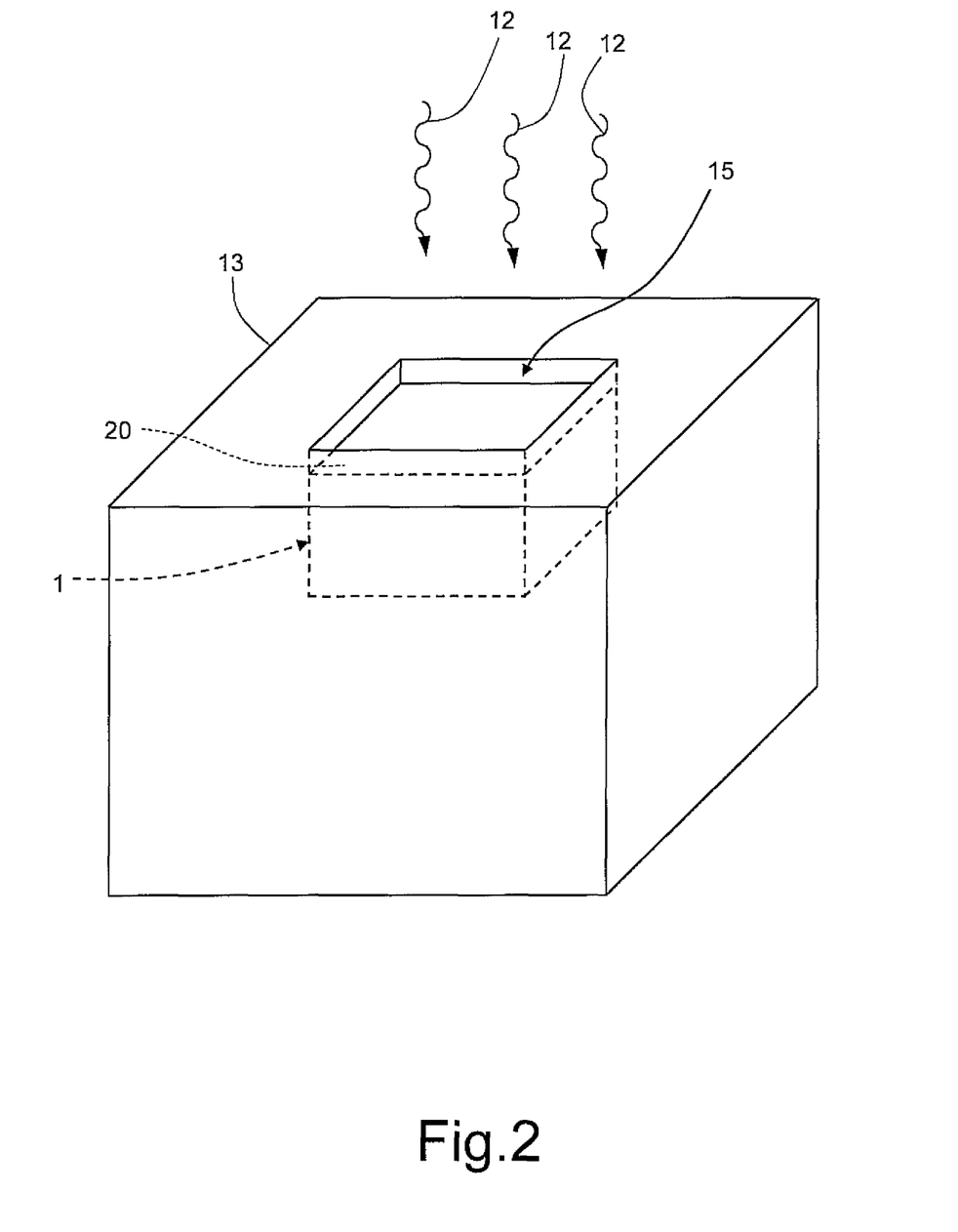
FIG. 2 is a schematic plan view illustrating a package housing the photodetector device of FIG. 1.

As illustrated schematically in FIG. 2, the photodetector 1 can be inserted in a package 13, for example, of a plastic type, provided with a window 15 that enables access of the light radiation 12 towards the active area 8 of the photodetector 1. However, the window 15 does not require any particular protective elements that are also transparent to the incident light radiation 12. The necessary protection is provided by the cover layer 20. In this way, an economic advantage is obtained in so far as it is possible to use a plastic package without quartz windows.

The package 13 houses the photodetector 1 so that the latter faces the window 15 in such a way as to receive the light radiation 12 in the active-area region 8 through the cover layer 20. The cover layer 20 hence functions as interface between the active area 8 and the environment external to the package, through the window 15.

Figure 3:
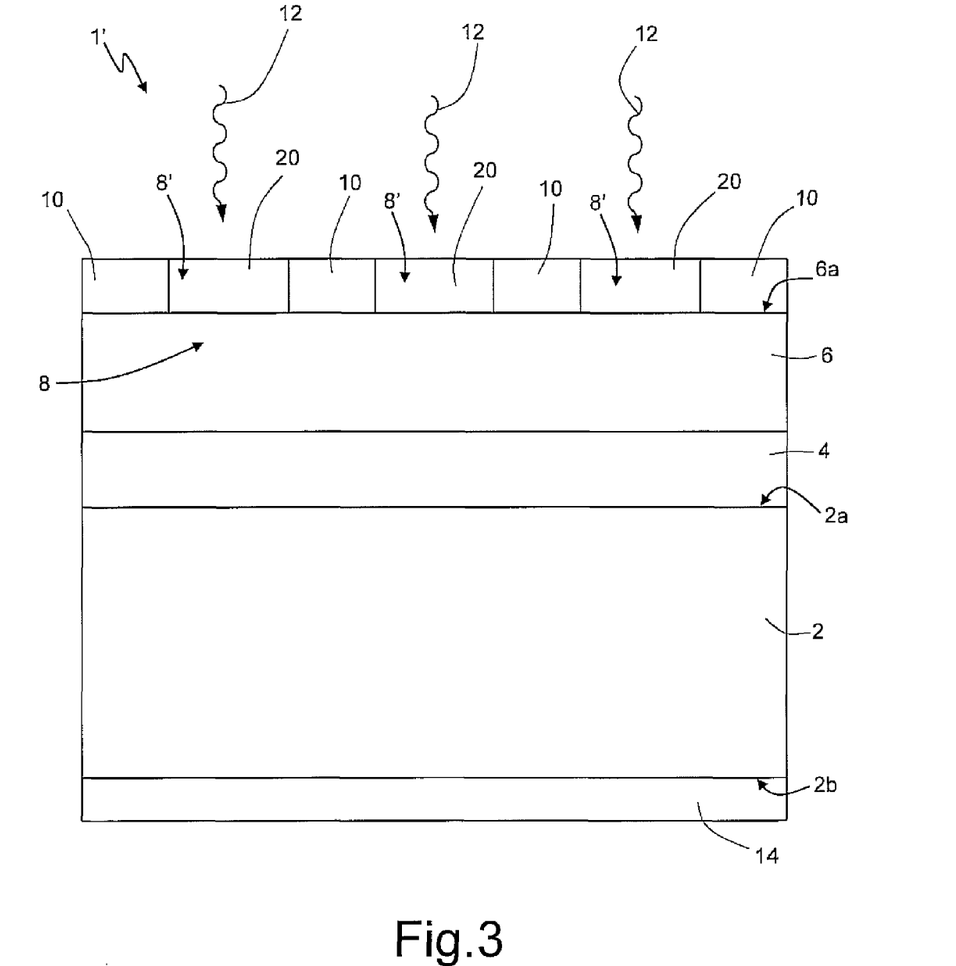
FIG. 3 is a schematic cross-sectional view illustrating a photodetector device according to a further embodiment.

FIG. 3 shows a photodetector 1' according to an embodiment alternative to that of FIG. 1. In this case, the PDMS cover layer 20 extends over the top surface 6a of the active layer 6 in a region corresponding to the surface portions 8' of the active area 8, between the Schottky contacts 10 and not over the Schottky contacts 10. The cover layer 20 hence has a thickness similar to the thickness of the Schottky contacts 10.

According to a further embodiment of the present invention (photodetector 1", FIG. 4), the PDMS cover layer 20 extends over the top surface 6a of the active layer 6, in a region corresponding to the surface portions 8' of the active area 8, between the Schottky contacts 10 and partially over the Schottky contacts 10.

Both the photodetector 1' and the photodetector 1" can be housed in a package 13 such as the one described with reference to FIG. 2.

The PDMS is a silicone elastomer comprising molecules having a structure with repeated siloxane (Si—O) units, with at least one silicon-carbon bond. The chemical and physical properties of silicone polymers can be controlled by regulating the concentration and type of organic groups bound to the silicon molecules. The methyl group ($CH_3$), which concurs in forming polydimethylsiloxane (PDMS), is known and used in various industrial applications. The most widely known applications of PDMS are currently those in the microfluidic field.

PDMS has, however, also excellent optical properties, owing to its transparency at a wavelength in the visible and ultraviolet spectra. In particular, the present applicant has found that the characteristics of absorption by PDMS of UV radiation are not very different from those of ultraviolet-degree glass. The present applicant has moreover found that PDMS has characteristics of absorption in the ultraviolet that are considerably lower than other resins.

Furthermore, since PDMS is an elastomer, the value of Young's modulus (also referred to as "elastic modulus") of PDMS is much lower than that of the silicon oxide and silicon nitride. This means that PDMS induces less intense interface stresses than does silicon oxide or silicon nitride. Hence, with reference to FIG. 1 (but the same applies to FIGS. 3 and 4), the stress induced at the interface between the cover layer 20 and the active layer 6, and the stress induced at the interface between the cover layer 20 and the Schottky contacts 10, is low. Consequently, the likelihood of breakdown or physical variations of the cover layer 20 and/or of the active layer 6 and/or of the Schottky contacts 10 is much lower than the one known in the art, where the cover layer is made of $SiO_2$ or, $Si_3N_4$.

Further advantageous properties of PDMS include the fact that it is chemically inert and has a low cost.

The cover layer 20 is formed at the end of the steps of manufacture of the photodetector 1. Intermediate steps of manufacture of the photodetector 1 are not described in detail herein in so far as they are known to those skilled in the art.

The manufacturing steps described regard a process of formation of the photodetector 1 of FIG. 1. However, what has been described herein applies also for the photodetectors 1' and 1".

The photodetector 1 can be produced by providing the substrate 2, made of 4H—SiC with N+ doping. Then, grown epitaxially on the front side 2a of the substrate 2 is the buffer layer 4, made of 4H—SiC with N+ doping. Doping can be carried out by implantation at the end of the step of epitaxial growth of the buffer layer 4 or during the step of epitaxial growth itself, by introducing dopant species of an N type within the chamber in which the epitaxial growth takes place. As an alternative to epitaxial growth, the buffer layer 4 can be formed by means of known techniques of deposition of SiC (e.g., sputtering, CVD, etc.).

Then, formed, for example, via epitaxial growth, over the buffer layer 4 is the active layer 6, made of 4H—SiC doped N−. Also in this case, the doping can be obtained via implantation following upon growth of the active layer 6 or by introducing dopant species of an N type into the chamber in which epitaxial growth occurs, in a known way.

Next, the Schottky contacts 10 are formed on the top surface 6a of the active layer 6. The Schottky contacts 10 are formed, for example, by depositing a metal layer using the sputtering technique or some other appropriate technique, and shaping, through successive lithographic and etching steps, the metal layer thus deposited so as to obtain the desired interdigitated structure. Alternatively, the Schottky contacts 10 can be obtained with some other conductor material, other than metal, for example, doped polysilicon, or some other material still.

Then, the back contact 14 is formed on the back side 2b of the substrate 2, in a way similar to what has been described with reference to formation of the Schottky contacts 10 (in this case, however, lithographic and etching steps may not be necessary).

The step of formation of the cover layer 20 according to the present approach includes preparing a mixture comprising a part of bulk elastomer with a part of curing agent, in a ratio of approximately 1:1 (other ratios between bulk elastomer and curing agent commonly used comprise 3:1, 10:1, 20:1, 30:1).

This is then followed by a mixing step and a subsequent degassing step, to eliminate from the mixture air in excess (to prevent formation of bubbles of air in subsequent process steps). This last step is performed by introducing the mixture of bulk elastomer and curing agent into a vacuum chamber in vacuum conditions for a time suitable to remove all the excess air (which may vary according to the amount of mixture and excess air present therein).

Then, the mixture thus obtained is poured on the top surface 6a of the active layer 6 of the photodetector 1. It is evident that, according to whether the embodiment of FIG. 1, FIG. 3, or FIG. 4 is considered, the step of pouring the liquid PDMS on the top surface 6a of the active layer 6 includes: pouring the PDMS over the entire top surface 6a of the active layer 6 between and over the Schottky contacts 10 (FIG. 1); or else, pouring the PDMS on the top surface 6a of the active layer 6 only in a region corresponding to the spaces between the Schottky contacts 10 and not over the Schottky contacts 10 (FIG. 3); or else, pouring the PDMS on the top surface 6a of the active layer 6 in a region corresponding to the spaces between the Schottky contacts 10 and only partially over the Schottky contacts 10 (FIG. 4).

Figure 4:
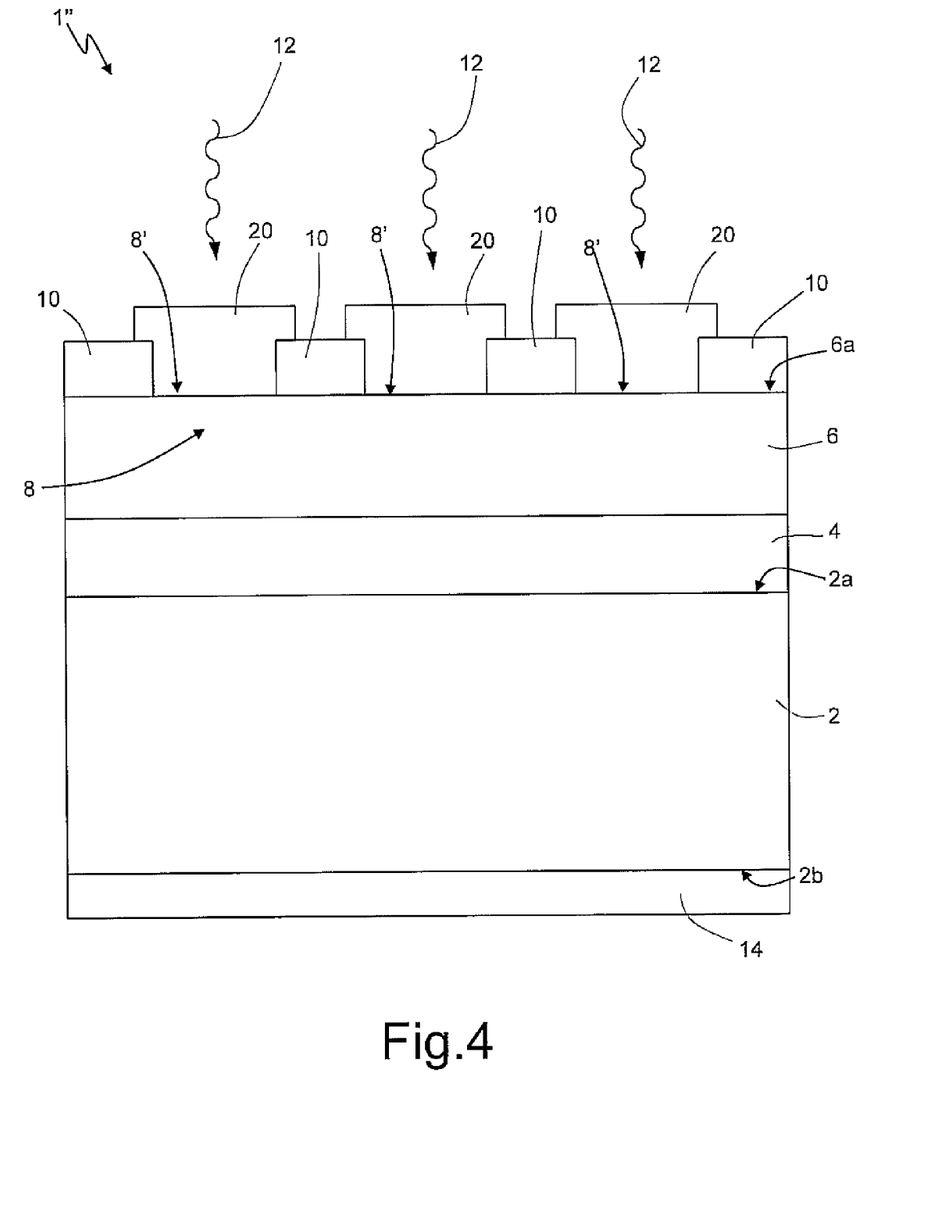
FIG. 4 is a schematic cross-sectional view illustrating a photodetector device according to a further embodiment.

Alternatively, the embodiments of FIG. 3 and FIG. 4 can be obtained by pouring the PDMS over the entire top surface 6a of the active layer 6 between and over the Schottky contacts 10 and then removing the excess PDMS over the Schottky contacts 10 (for example, via appropriate etching steps). Alternatively, for active-area regions 8' of large dimensions, it is possible to pour the PDMS in a selective way in areas corresponding thereto.

This is followed by a step of thermal treatment at a temperature of between approximately 80° C. and 120° C. for a time comprised between approximately 30 minutes and 2 hours, in inert atmosphere (i.e., in environment with nitrogen, $N_2$), to favor solidification of the PDMS. It is here pointed out that the thermal treatment is useful for speeding up the solidification step, but is not necessary. In fact, the PDMS solidifies also at room temperature (in a time, obviously, much greater than what can be obtained with the thermal treatment).

The photodetector 1 of FIG. 1 is thus formed (and, likewise formed, with the appropriate process variants described, are the photodetectors 1' and 1" of FIGS. 2 and 3).

The present applicant has found that the current-voltage (I-V) characteristics of the photodetector 1 in forward and reverse biasing (FIGS. 4a, 4b), as likewise the optical responsivity (FIGS. 5a, 5b), do not vary significantly with respect to those obtained using a photodetector of a known type, similar to the photodetector 1, but without the cover layer 20.

Figure 5A:
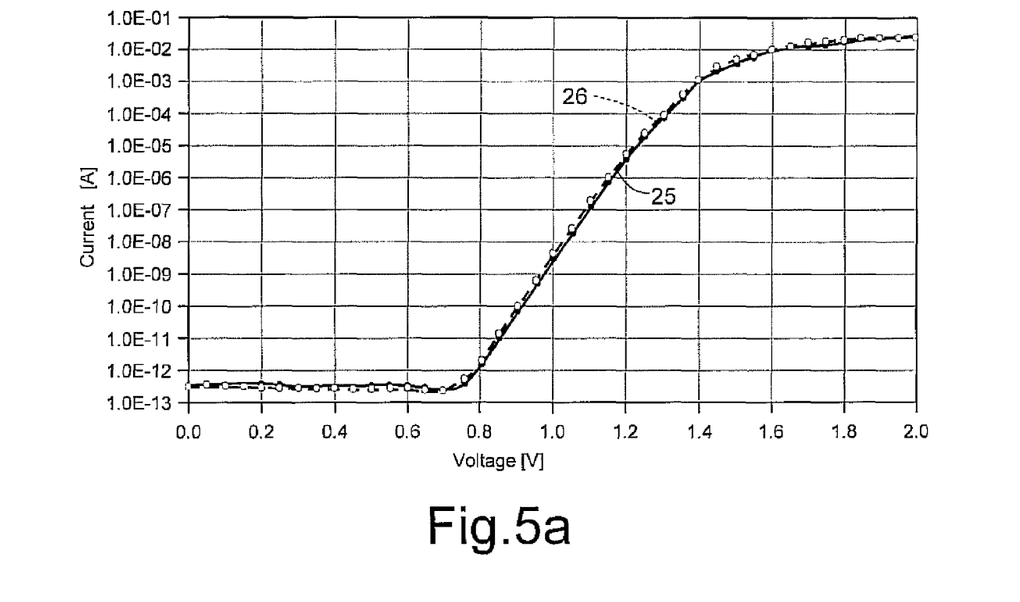
FIGS. 5a and 5b are graphs illustrating current-voltage characteristics in forward and reverse biasing, respectively, of a photodetector device according to the embodiments of FIGS. 1, 3, 4 as compared to a conventional photodetector device.

FIG. 5a shows I-V curves in direct biasing regarding (curve 25) a photodetector of a known type similar to the photodetector 1 but without the cover layer 20 (i.e., with surface portions 8' of the active area 8 directly exposed), and (curve 26) the photodetector 1 according to the present invention. As may be noted, the curves substantially coincide with one another, demonstrating that the behavior of the photodetector in direct biasing is not affected by the presence of the PDMS cover layer 20.

Figure 5B:
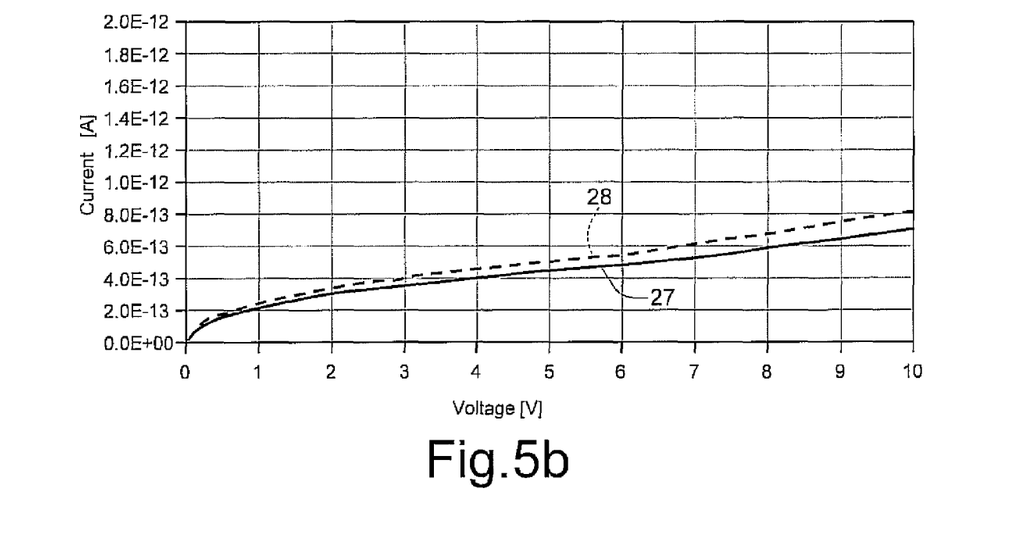

FIG. 5b shows I-V curves in reverse biasing regarding (curve 27) a photodetector of a known type similar to the photodetector 1 but without the cover layer 20 (i.e., with surface portions 8' of the active area 8 directly exposed), and (curve 28) to the photodetector 1 according to the present approach. As may be noted also in this case, the curves 27 and 28 show that the behavior of the photodetector 1 is minimally affected by the presence of the cover layer 20. From the curve 28 it may be noted that the dark current (in reverse biasing) is kept at low values (some picoampère), comparable with those of the curve 27, confirming that the stress induced by the presence of the cover layer 20 in the active layer 6 (in particular at the surface 6a) is minimal.

Figure 6A:
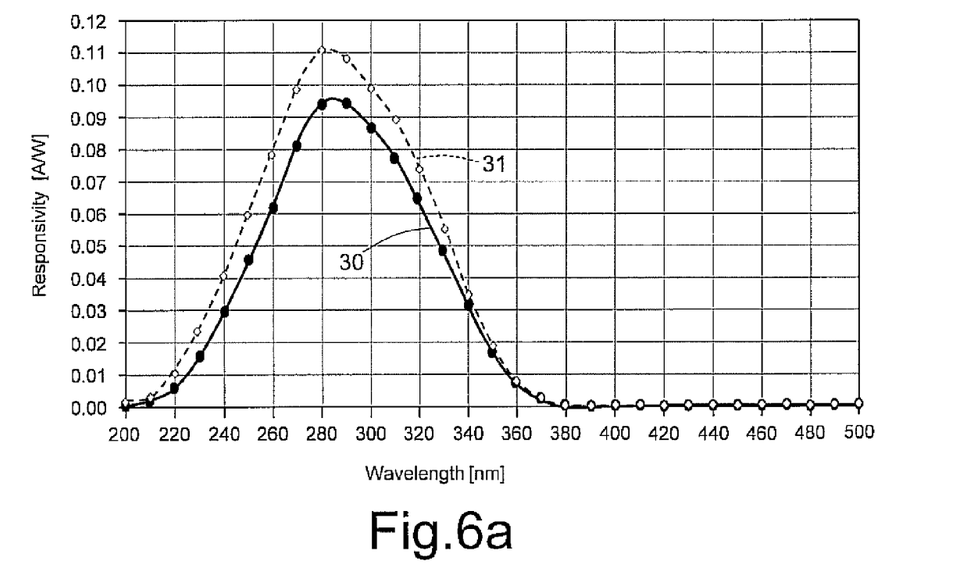
FIGS. 6a and 6b are graphs illustrating curves of optical responsivity and gain as the wavelength of an incident light radiation of the photodetector device varies according to the embodiments of FIGS. 1, 3, 4 as compared to a conventional photodetector device.

FIG. 6a shows curves of optical responsivity regarding (curve 30) a photodetector of a known type similar to the photodetector 1 but without the cover layer 20 (i.e., with surface portions 8' of the active area 8 directly exposed), and (curve 31) to the photodetector 1 according to the present approach. From FIG. 6a it may be noted that the presence of the cover layer 20 improves the optical responsivity of the photodetector 1, increasing it. This effect is evident in particular at low wavelengths. Also the quantum efficiency increases thanks to the presence of the cover layer 20. The present applicant has found that: for incident radiation with wavelengths of 250 nm the quantum efficiency passes from a value of 22.4% (known photodetector, without cover layer 20) to a value of 30% (photodetector 1 of FIG. 1); for incident radiation with wavelengths of 290 nm the quantum efficiency passes from a value of 40.2% (known photodetector, without cover layer 20) to a value of 46.2% (photodetector 1 of FIG. 1); and for incident radiation with wavelengths of 330 nm the quantum efficiency passes from a value of 18.3% (known photodetector, without cover layer 20) to a value of 20.5% (photodetector 1 of FIG. 1).

Figure 6B:
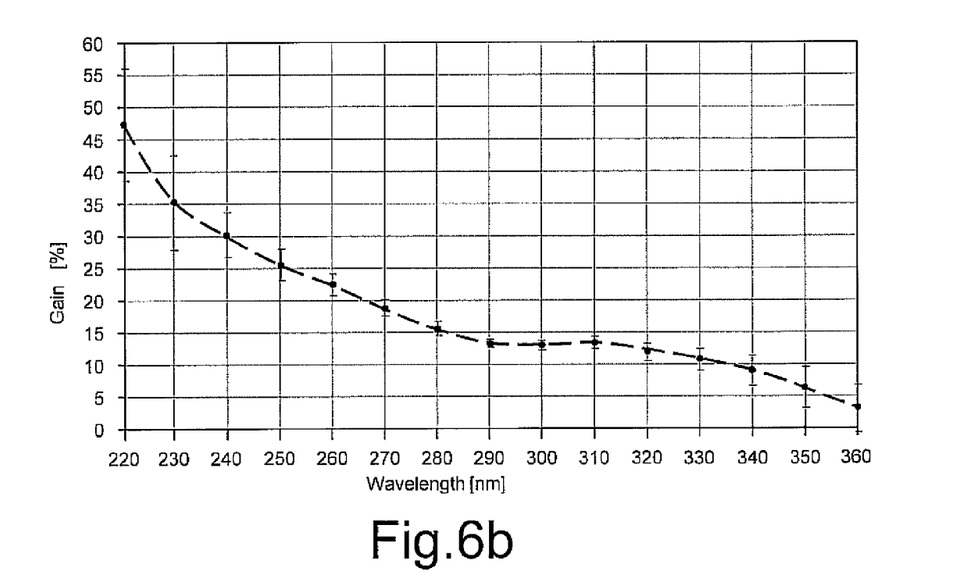

FIG. 6b shows a curve of average gain (in percentage) of the optical responsivity of the photodetector 1 according to the present approach as compared to the corresponding gain of a photodetector of a known type, similar to the photodetector 1 but without the cover layer 20 (i.e., with surface portions 8' of the active area 8 directly exposed to light radiation). As may be noted, the presence of the cover layer 20 brings a considerable benefit to the gain of the photodetector 1, particularly below 270 nm.

The high error margin associated to measurements made at low wavelengths (<250 nm) and high wavelengths (>330 nm) is due to the limited responsivity of the photodetectors used for the tests at these wavelengths.

In any case, from the curves of FIG. 6b it may be noted that the gain is kept high also in the case of photodetector provided with cover layer 20. This means that the optical losses that can be ascribed to the cover layer 20 are not important.

The curves of FIGS. 5a and 5b were acquired at an room temperature of approximately 25° C., using a source of UV radiation of a tungsten-halogen type provided with an appropriate filter designed to select the wavelengths of interest, i.e., comprised approximately in the range 200-400 nm.

The PDMS cover layer 20 hence shows excellent antireflective properties throughout the ultraviolet range, and in particular for wavelengths shorter than 260 nm where the absorption of the 4H—SiC active layer 6 is very high, given that the majority of the flow of incident light is absorbed within a few tens of nanometers of depth from the surface 6a of the active layer 6.

Furthermore, the low temperatures required for the process of formation of the cover layer 20 (the process can in fact be carried out at room temperature), the relatively low temperatures for the thermal process for the solidification of the cover layer 20, together with the low viscosity of PDMS, do not affect significantly the electrical properties and performance of the photodetector according to the present approach. In particular, the low leakage currents confirm the substantial absence of charges at the interface between the active layer 6 and the cover layer 20 caused directly by the presence of the cover layer 20, and the substantial absence of stresses at the interface between the active layer 6 and the cover layer 20 such as to cause a significant degradation of the electrical performance of the photodetector 1.

Furthermore, the cover layer 20 does not only perform the function of protection of the active layer 6 from external agents (dust, contaminants, etc.) that could cause a degradation thereof, but also guarantees an improvement of the performance of the photodetector 1 during use. In fact, the presence of the cover layer 20 leads to a reduction of the radiation reflected at the top surface 6a of the active layer 6. To verify the antireflective properties of the cover layer 20, to a first approximation, it is possible to calculate the transmission of the light radiation at the interfaces between the air and the cover layer 20 and between the cover layer 20 and the active layer 6, i.e., respectively, at the air/PDMS and PDMS/4H—SiC interfaces.

For angles of incidence of the light radiation substantially orthogonal to the exposed surface of the cover layer 20, the transmission factor $T_1$ at the air/PDMS interface can be calculated applying Eq. (1)

$$T_1 = (4 n_{AIR} n_{PDMS})/(n_{AIR} + n_{PDMS})^2 \qquad (1)$$

where $n_{AIR}$ is the refractive index of air ($n_{AIR} \approx 1$) and $n_{PDMS}$ is the refractive index of the cover layer 20 and is a function of the wavelength of the incident radiation according to an approximated typical formula (2)

$$n_{PDMS}=1.395+(7.52\cdot10^3)/\lambda_i^2 \qquad (2)$$

where $\lambda_i$ is the wavelength of the incident radiation.

Likewise, for angles of incidence of the light radiation substantially orthogonal to the surface $6a$ of the active layer $6$, the transmission factor $T_2$ at the PDMS/4H—SiC interface can be calculated applying Eq. (3)

$$T_2=(4n_{PDMS}n_{4H\text{-}SiC})/(n_{PDMS}+n_{4H\text{-}SiC})^2 \qquad (3)$$

where $n_{4H\text{-}SiC}$ is the refractive index of the active layer $6$ and is a function of the wavelength of the incident radiation according to Eq. (4)

$$n_{4H\text{-}SiC}=2.561+(3.4\cdot10^4)/\lambda_i^2 \qquad (4)$$

The total transmission factor is given by $T_{TOT}=T_1\cdot T_2$.

Figure 7:
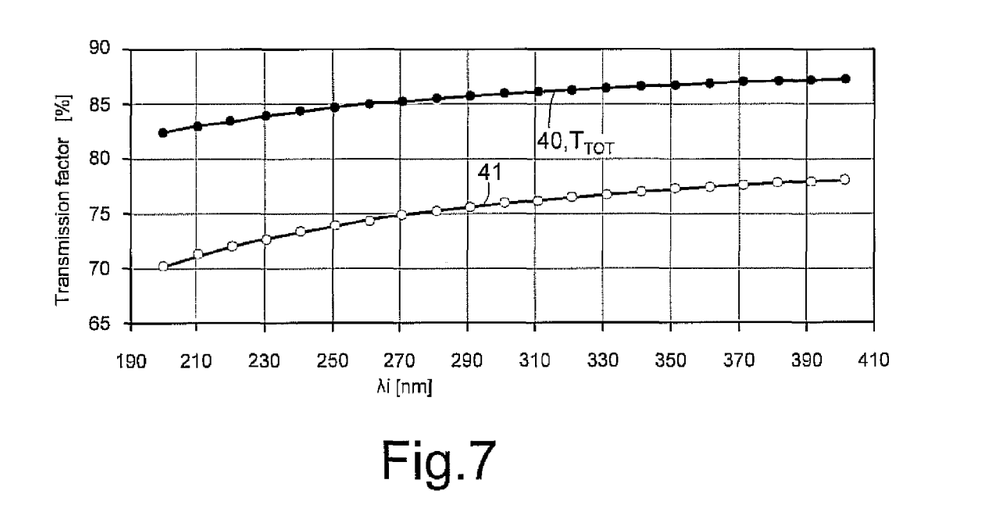
FIG. 7 is a graph illustrating the variation of the transmission factor as the wavelength of an incident light radiation of the photodetector device varies according to any one of the embodiments of FIGS. 1, 3, 4 as compared to a conventional photodetector device.

FIG. 7 shows the variation of the total transmission factor $T_{TOT}$ as a function of the incident wavelength $\lambda_i$, in an ideal case where the dependence of the transmission factor upon the thickness of the layers considered is not taken into account (all the layers are approximated as having infinite thickness).

The curve 40 of FIG. 7 represents the total transmission factor $T_{TOT}$ measured with reference to a photodetector provided with the cover layer 20 according to the present approach. The curve 41 of FIG. 7 represents a transmission factor measured with reference to a photodetector without the cover layer 20 (hence to the air/4H—SiC interface).

As may be noted, for all the wavelengths of interest (UV), the presence of the cover layer 20 results in an improvement of the total transmission factor $T_{TOT}$. The cover layer 20 may also be effective as antireflective layer.

The presence of the PDMS cover layer 20, together with the interdigitated structure of the photodetector 1, 1', 1" (which leaves exposed to the incident radiation portions of the active area 8) may provide high quantum efficiency of detection for ultraviolet radiation.

The cover layer 20 moreover may have a function of protection of the underlying layers. Furthermore, the cover layer 20 may perform also the function of passivation layer.

Figure 8:
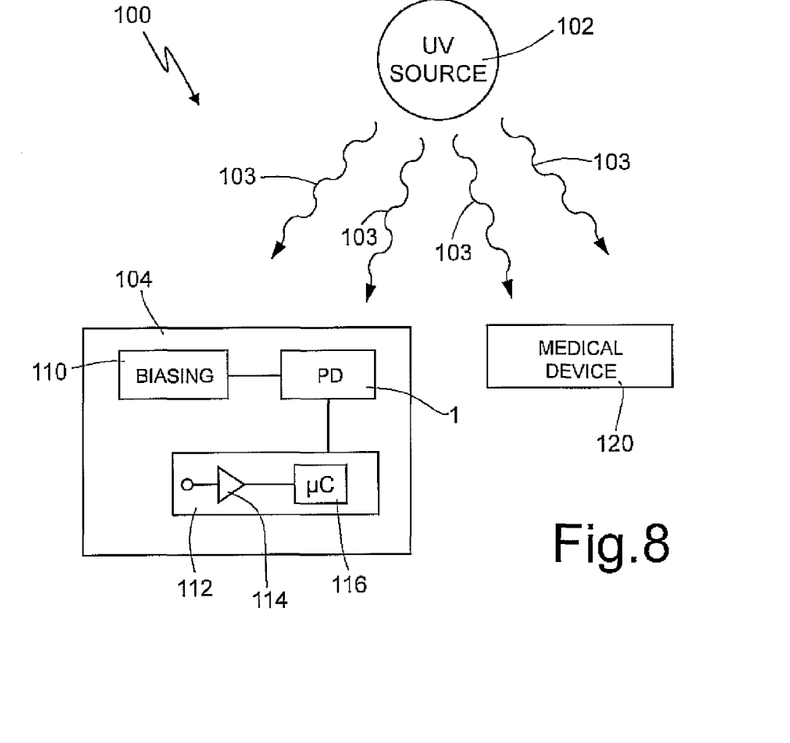
FIG. 8 is a schematic diagram illustrating a system for monitoring an ultraviolet source including the photodetector device according to any one of the embodiments of FIGS. 1, 3, 4.

FIG. 8 shows a system 100 that uses the photodetector 1 according to the present approach. The system 100 is, according to an embodiment, a sterilization system that uses an ultraviolet radiation as sterilizing radiation, to sterilize, for example, a generic medical device (designated in the figure by the reference 120).

The system 100 includes: a source of ultraviolet radiation 102, for example, including a mercury or LED lamp, configured for emitting an ultraviolet radiation 103 in the range of wavelengths included between 200 and 400 nm; and a monitoring block 104, configured for receiving and monitoring the ultraviolet radiation 103. Monitoring of the ultraviolet radiation 103 is necessary to control constantly possible degradation of the source of ultraviolet radiation 102, which could vitiate proper sterilization.

The monitoring block 104 includes: the photodetector 1 of FIG. 1 (for example, housed in the package 13), set in such a way as to receive, in a region corresponding to the active area through the cover layer 20, the ultraviolet radiation 103; a biasing block 110 coupled to the photodetector 1 for biasing, during use, the photodetector 1 (in particular, including a voltage generator connected between the Schottky contacts 10 and the back biasing terminal 14); and a processor 112, coupled to the photodetector 1 to acquire the current signal generated by the photodetector 1 in response to the ultraviolet radiation 103. The processor 112 includes, for example, an amplifier 114 designed to generate with a certain gain a voltage signal correlated to the flow of current generated by the photodetector 1, and a computing block 116, for example, a microcontroller, designed to collect the voltage signal generated by the amplifier 114 and compare the signal with a predefined threshold value. If the voltage signal has a value higher than the predefined threshold, the source of ultraviolet radiation 102 operates properly (the ultraviolet radiation 103 has an intensity sufficiently high to meet the needs of sterilization); instead, if the voltage signal has a value lower than the predefined threshold, then the source of ultraviolet radiation 102 must be replaced.

Figure 9:
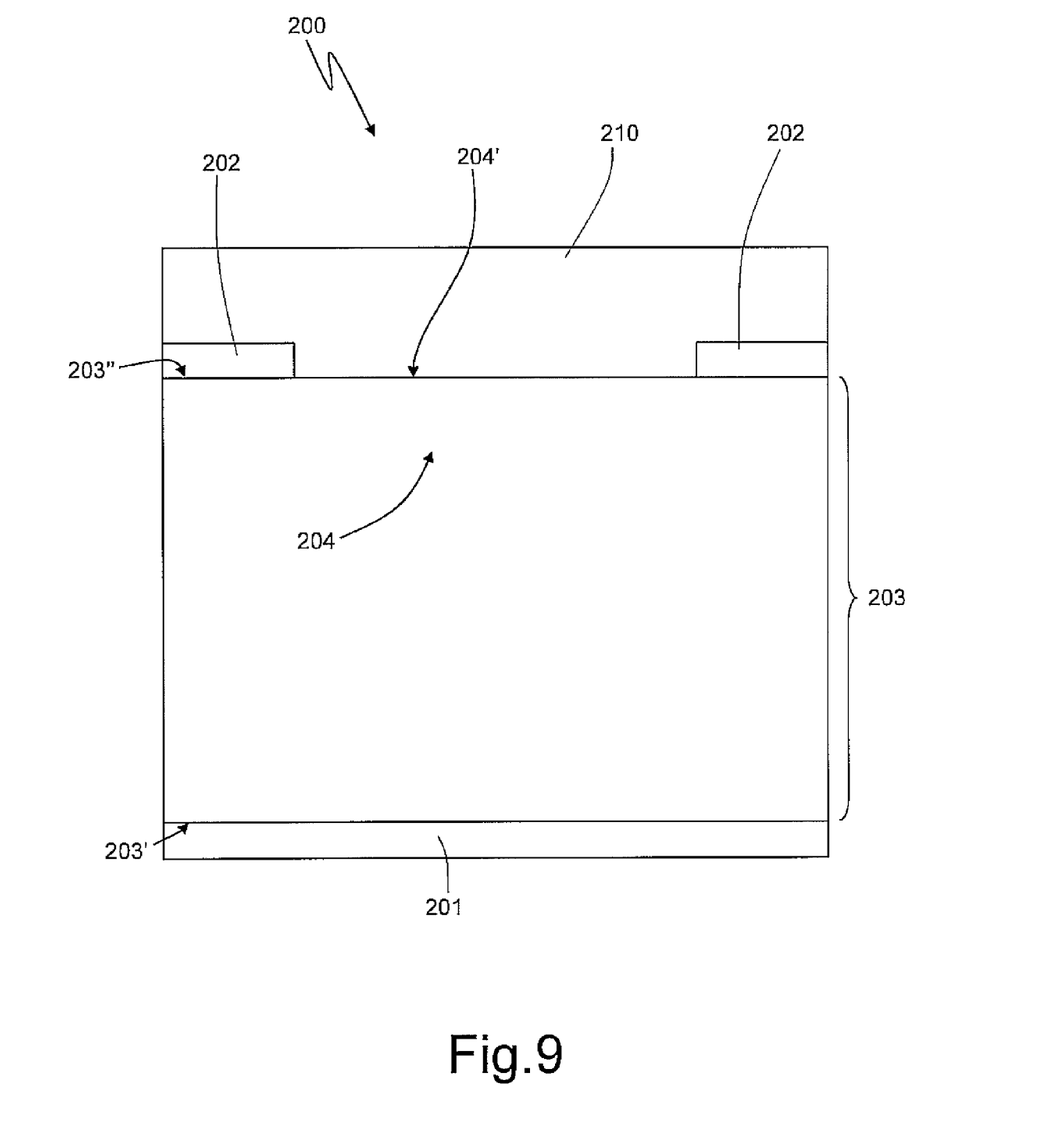
FIG. 9 is a schematic diagram illustrating a photodetector device according to a further embodiment.

As an alternative to what has been described, the monitoring block 104 can include indifferently the photodetector 1' of FIG. 3, the photodetector 1" of FIG. 4, or, in general any other photodetector including a PDMS cover layer according to the present approach (for example, the photodetector 200 described in what follows with reference to FIG. 9).

Use, in the system 100, of a photodetector including a PDMS cover layer according to the present approach is advantageous in so far as the present applicant has found that aging of the PDMS cover layer in response to high flows of light is slow, thus rendering photodetectors provided with the PDMS cover layer ideal for applications of this sort.

Finally, it is clear that modifications and variations may be made to what has been described and illustrated herein, without thereby departing from the sphere of protection of the present approach. In particular, the present approach is not limited to 4H—SiC structures, but extends to structures of silicon carbide with different crystallographic structure, for example, but not only, 3C—SiC, 6H—SiC. In addition, doping of the layers that form the photodetector 1, 1', 1" can be of a P type.

Furthermore, the present approach is not limited to photodetectors made of silicon carbide, but can be applied to photodetectors the active area of which is made of layers of a material other than SiC, for example, including semiconductor materials designed for use in the optical field for photodetection, in particular in the ultraviolet range such as titanium oxide ($TiO_2$), alloys of aluminium gallium and nitride (AlGaN), and others still. Furthermore, the present approach is not limited to photodetectors designed to detect an ultraviolet radiation, but extends to photodetectors designed to detect radiation having other wavelengths (in the infrared or in the visible, for example). Semiconductor materials designed for use in the optical range for photodetection at a wavelength different from the ultraviolet include, for example, silicon (Si), germanium (Ge), gallium arsenide (GaAs) and other materials still such as In, InGaAs, InGaAsP, etc.

Finally, a PDMS cover layer of the type described according to the present approach can be formed on devices other than the photodetector 1, 1', 1"; for example, it can be applied to generic photoconductive detectors, p-n and p-i-n junction photodiodes, photodiodes with generation of avalanche carriers, single photon avalanche diode (SPAD) devices, and others still. The structure of the photodiode described with reference to FIGS. 1, 3, and 4 consequently does not pose a limitation of the scope of the present approach.

FIG. 9 shows, for example, a photodetector 200 (photodiode) including a biasing contact 201 formed on the back side 203', and a biasing contact 202 formed on the front side 203" of a semiconductor body 203. The biasing contact 202 that extends on the front side 203" has, in top plan view, for example, a circular or polygonal shape and defines internally a completely exposed portion 204' of active area 204. In this case, an interdigitated structure of the Schottky contacts of the type illustrated with reference to FIGS. 1, 2, and 3 is, hence, not present. The photodetector 200 further includes a PDMS cover layer 210, which extends in a region corresponding to the active area 204, over the latter. The steps of formation of the cover layer 210 are similar to those already described for formation of the cover layer 20. Also the properties and advantages associated to the cover layer 210 are the same as those already described with reference to the cover layer 20. During use of the photodetector 200, a light radiation (in particular, with reference to a form of use, ultraviolet light) is received by the active area 204 through the cover layer 210.

Furthermore, the photodetector 200 can be housed in a package 13 of the type described with reference to FIG. 2.

That which is claimed:

1. A photodetector device comprising:
    a semiconductor body having a front surface;
    an active-area region extending in the semiconductor body facing the front surface and configured to receive ultraviolet light radiation and generate, in response to the ultraviolet light radiation received, electric charge carriers; and
    a protective and antireflective cover layer comprising polydimethylsiloxane and extending on the front surface in the active-area region so that the ultraviolet light radiation is received by the active-area region through the cover layer.

2. The photodetector device according to claim 1, wherein the cover layer extends in direct contact with the active-area region facing the front surface of the semiconductor body.

3. The photodetector device according to claim 1, further comprising a conduction terminal extending on the front surface in direct electrical contact with the active-area region, and including an interdigitated structure having a plurality of fingers; wherein the cover layer extends between said fingers of the conduction terminal.

4. The photodetector device according to claim 3, wherein the cover layer extends at least one of partially and completely over the conduction terminal.

5. The photodetector device according to claim 1, further comprising a conduction terminal extending on the front surface laterally to the active-area region; wherein the cover layer extends at least one of partially and completely over the conduction terminal.

6. The photodetector device according to claim 1, wherein the semiconductor body comprises:
    a substrate of semiconductor material having a first doping value;
    a buffer layer of semiconductor material having the first doping value and extending on the substrate; and
    an active layer of semiconductor material having a second doping value lower than the first doping value, and extending on the buffer layer and includes the active area;
    wherein the semiconductor material comprises at least one of silicon carbide, germanium, silicon, indium phosphide, gallium nitride, gallium arsenide, aluminium gallium and indium phosphide.

7. A photodetector package comprising:
    an encapsulation structure provided with a window configured to provide access of ultraviolet light radiation within the package; and
    a photodetector device housed in the encapsulation structure, and comprising
        a semiconductor body having a front surface,
        an active-area region extending in the semiconductor body facing the front surface and is configured to receive ultraviolet light radiation and generate, in response to the ultraviolet light radiation received, electric charge carriers, and
        a protective and antireflective cover layer comprising polydimethylsiloxane and extending on the front surface in the active-area region so that the ultraviolet light radiation is received by the active-area region through the cover layer;
    the photodetector device facing the window to receive the ultraviolet light radiation at the active-area region through the cover layer.

8. The photodetector package according to claim 7, wherein the cover layer extends in direct contact with the active-area region facing the front surface of the semiconductor body.

9. The photodetector package according to claim 7, wherein the photodetector device further comprises a conduction terminal extending on the front surface in direct electrical contact with the active-area region, and including an interdigitated structure having a plurality of fingers; wherein the cover layer extends between said fingers of the conduction terminal.

10. A system for monitoring a source of ultraviolet light radiation, comprising:
    a photodetector device comprising
        a semiconductor body having a front surface,
        an active-area region extending in the semiconductor body facing the front surface and is configured to receive ultraviolet light radiation and generate, in response to the ultraviolet light radiation received, electric charge carriers, and
        a protective and antireflective cover layer comprising polydimethylsiloxane extending on the front surface in the active-area region so that the ultraviolet light radiation is received by the active-area region through the cover layer,
        the photodetector device configured to generate a signal in response to reception of the ultraviolet light radiation; and
    a biasing device electrically coupled to the photodetector device and configured to bias the photodetector device; and
    a processor configured to receive the signal and supply, based thereon, monitoring data associated to at least one characteristic of operation of the source of ultraviolet light radiation.

11. The system according to claim 10, wherein the cover layer extends in direct contact with the active-area region facing the front surface of the semiconductor body.

12. The system according to claim 10, wherein the photodetector device further comprises a conduction terminal extending on the front surface in direct electrical contact with the active-area region, and including an interdigitated structure having a plurality of fingers; wherein the cover layer extends between said fingers of the conduction terminal.

13. A method for manufacturing a photodetector device, the method comprising:
    providing a semiconductor body having a front surface;
    forming an active-area region in the semiconductor body facing the front surface, the active-area region being configured to receive ultraviolet light radiation and generate, in response to the ultraviolet light radiation received, electric charge carriers; and
    forming a protective and antireflective cover layer comprising polydimethylsiloxane on the front surface in the active-area region so that the ultraviolet light radiation is received by the active-area region through the cover layer.

14. The method according to claim 13, wherein forming the cover layer comprises forming the cover layer in direct contact with the active-area region facing the front surface of the semiconductor body.

15. The method according to claim 13, further comprising forming a conduction terminal on the front surface in direct electrical contact with the active-area region, the conduction terminal having an interdigitated structure including a plurality of fingers; wherein forming the cover layer comprises forming the cover layer between the fingers of the conduction terminal.

16. The method according to claim 15, wherein forming the cover layer comprises forming the cover layer at least one of partially and completely over the conduction terminal.

17. The method according to claim 13, further comprising forming a conduction terminal on the front surface alongside the active-area region; wherein forming the cover layer comprises forming the cover layer at least one of partially and completely over the conduction terminal.

18. The method according to claim 13, wherein forming the semiconductor body comprises:
   providing a substrate of semiconductor material having a first doping value;
   forming on the substrate a buffer layer of semiconductor material having the first doping value; and
   forming on the buffer layer an active layer of semiconductor material having a second doping value lower than the first doping value, the active area being defined in the active layer;
   wherein the semiconductor material comprises at least one of silicon carbide, germanium, silicon, indium phosphide, gallium nitride, gallium arsenide, aluminium gallium and indium phosphide.

19. The method according to claim 13, wherein forming the cover layer comprises:
   mixing a polydimethylsiloxane-based elastomer with a curing agent, to form a polydimethylsiloxane mixture;
   removing excess air from the polydimethylsiloxane mixture;
   applying the polydimethylsiloxane mixture on the top surface of the photodetector device; and
   performing a thermal treatment configured to promote solidification of the polydimethylsiloxane mixture.

* * * * *